(12) United States Patent
Nonaka et al.

(10) Patent No.: US 6,218,667 B1
(45) Date of Patent: Apr. 17, 2001

(54) SENSOR ELEMENT WITH SMALL AREA LIGHT DETECTING SECTION OF BRIDGE STRUCTURE

(75) Inventors: Ken-Ichi Nonaka; Seiichi Yokoyama; Toshifumi Suzuki, all of Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/150,330

(22) Filed: Sep. 9, 1998

(30) Foreign Application Priority Data

Sep. 9, 1997 (JP) .................................................. 9-284207
Sep. 9, 1997 (JP) .................................................. 9-284209
Aug. 31, 1998 (JP) ................................................ 10-244311

(51) Int. Cl.$^7$ .............................. H01L 35/02; G01J 1/02
(52) U.S. Cl. ......................... 250/353; 250/349; 250/332
(58) Field of Search .................................. 250/353, 349, 250/332

(56) References Cited

U.S. PATENT DOCUMENTS

| | | |
|---|---|---|
| 4,754,139 | 6/1988 | Ennulat et al. . |
| 5,021,663 | 6/1991 | Hornbeck . |
| 5,260,225 | 11/1993 | Liu . |
| 5,286,976 | 2/1994 | Cole . |
| 5,300,915 | 4/1994 | Higashi . |
| 5,367,167 | 11/1994 | Keenan . |
| 5,371,397 | 12/1994 | Maegawa et al. . |
| 5,393,978 | * 2/1995 | Schwarz ............................. 250/353 |
| 5,399,897 | 3/1995 | Cunningham et al. . |
| 5,551,293 | 9/1996 | Boysel . |
| 5,701,008 | 12/1997 | Ray et al. . |

FOREIGN PATENT DOCUMENTS

| | | |
|---|---|---|
| 534768A1 | 3/1993 | (EP) . |
| 60-7767 | 1/1985 | (JP) . |
| 62-113035 | 5/1987 | (JP) . |
| 1-308927 | 12/1989 | (JP) . |
| 1-316619 | 12/1989 | (JP) . |
| 2-105025 | * 4/1990 | (JP) ................................... 250/353 |
| 6-163864 | 6/1994 | (JP) . |
| 7147433 | 6/1995 | (JP) . |
| 9113352 | 5/1997 | (JP) . |
| 9-218088 | 8/1997 | (JP) . |
| 1019671 | 1/1998 | (JP) . |
| 10-115556 | 5/1998 | (JP) . |
| 10-239157 | 9/1998 | (JP) . |
| 11-136471 | 5/1999 | (JP) . |
| 9401743 | 1/1994 | (WO) . |

OTHER PUBLICATIONS

"Patent Abstracts of Japan", JP 09 113352, vol. 097, No. 009, May 2, 1997.

* cited by examiner

Primary Examiner—Constantine Hannaher
Assistant Examiner—Andrew Israel
(74) Attorney, Agent, or Firm—Carrier, Blackman & Associates, P.C.; Joseph P. Carrier; William D. Blackman

(57) ABSTRACT

A sensor element includes a light detecting section (2), a wiring section and a microlens section (7, 8). The light detecting section (2) is formed to be spaced from a substrate (1) to detect an incident light. The wiring section is composed of leg sections (3, 4) and outputting sections (11, 12) formed to be spaced from the substrate in a peripheral portion of the light detecting section. The wiring section connects the detecting result of the light detecting section to patterns on the substrate. The microlens section is formed to be spaced from the light detecting section to collect and output the incident light to the light detecting section. An area of the light detecting section is equal to or smaller than ¼ of an area of the sensor element. The sensor element may further include a reflecting film formed under the light detecting section to reflect the incident light which passes through the light detecting section.

31 Claims, 7 Drawing Sheets

SENSOR ELEMENT WITH SMALL AREA LIGHT DETECTING SECTION OF BRIDGE STRUCTURE

BACKGROUND OF THE INVENTION

1. Field of the Invention

The present invention relates to a sensor with a bridge structure to detect an incident light.

2. Description of the Related Art

In a sensor device, e.g. an infrared sensor, a lot of sensor elements are arranged in a two-dimensional matrix, and used as an image sensor for obtaining an image of infrared rays. The infrared sensor is recently manufactured on a semiconductor substrate to have a very small size using a micromachining process, which is also used in an IC manufacturing process.

FIG. 1 is a perspective view illustrating the structure of a conventional infrared sensor of a non-cooling type which is manufactured using the micromachining process. FIG. 2 is a plan view of the conventional infrared sensor.

In the conventional infrared sensor, a light detecting section 2 is formed on a semiconductor substrate 1 to be spaced from the substrate 1. A sensor resistor pattern 5 is formed of a material whose resistance value changes depending upon temperature, on the surface of the light detecting section 2. Outputting sections 11 and 12 are connected to the light detecting section 2 and leg sections 3 and 4 are connected to the outputting sections 11 and 12, respectively. The detecting result of the light detecting section 2 is connected to a circuit (not shown) which is formed on the substrate 1, through the outputting sections 11 and 12 and the leg sections 3 and 4.

As seen from FIGS. 1 and 2, the non-cooling type infrared sensor can operate at room temperature. The non-cooling type infrared sensor can be made small in size, compared with a cooling type infrared sensor, because the cooling mechanism is unnecessary. However, the sensor sensitivity of the non-cooling type infrared sensor is low. Therefore, improvement of the sensor sensitivity becomes an important technical problem.

In a bolometer type infrared sensor, a change of the resistance value caused by the heat of the infrared rays inputted to the light detecting section 2 is taken out as an electric signal, and at least one of the following matters must be implemented to improve the sensor sensitivity. That is, (1) a quantity of infrared rays which are absorbed by the light detecting section 2 is increased, (2) noise which is generated in the light detecting section 2 is reduced, and (3) the heat insulation of the light detecting section 2 is improved. In order to improve a responsivity in addition to the sensor sensitivity, it is necessary to decrease thermal capacity of the light detecting section 2.

A high temperature coefficient (TCR) of the resistance and small noise are required as important characteristics of the material of the sensor resistor pattern 5. The temperature coefficient (TCR) and resistivity of the sensor resistor pattern 5 are in a trade off relation. Resistance noise and 1/f noise of noises to which the material of the sensor resistor pattern 5 is related becomes a problem in a practical use. Such resistance noise is dependent on the resistance value of the sensor resistor pattern 5. When the light detecting section 2 is made large in size, the resistance value increases so that it is difficult to decrease the resistance noise. Therefore, the resistivity of the material of the sensor resistor pattern 5 is required to be as small as possible. In this case, the temperature coefficient (TCR) of the resistor becomes small because of the above-mentioned trade off relation. As a result, it is difficult to improve the sensor sensitivity.

In order to decrease the thermal capacity of the light detecting section 2, it could be considered that a material with a small specific heat is used for the light detecting section 2, that the film thickness of the light detecting section 2 is made thin, and that the area of the light detecting section 2 is made small. However, because silicon oxide or silicon nitride is generally used for the light detecting section 2 for the reason of the manufacturing process, materials which can be used for the light detecting section 2 are limited. When the light detecting section is spaced from the substrate 1, a problem would be caused from the viewpoint of structural strength, if the film thickness of the light detecting section 2 is made thin. Therefore, in order to decrease the thermal capacity of the light detecting section 2, it is desirable to decrease the area of the light detecting section 2.

In order to increase the absorption quantity of the infrared rays by the light detecting section 2, it could be considered to increase the area of the light detecting section 2. However, when the area of the light detecting section 2 is increased, the infrared sensor itself must be made large in size. Also, the resolution is degraded. Further, the increase in size is contradictary to decreasing of the thermal capacity of the light detecting section 2.

Also, when the light detecting section 2 is spaced from the substrate 1, it is difficult to support the light detecting section 2 with a large area. Therefore, use of a lens has been proposed to increase the absorption quantity of the infrared rays by the light detecting section 2 without changing the area of the light detecting section 2. Such an infrared sensor is disclosed in Japanese Laid Open Patent Application (JP-A-Heisei 9-113352).

According to this reference, the infrared rays are collected by the lens, and are irradiated to the light detecting section. However, if the infrared rays are merely collected by the lens and irradiated to the light detecting section, the collected infrared rays pass through the light detecting section without sufficient absorption of them by the light detecting section, when the light detecting section is thin. Because the thickness of the light detecting section is as thin as about 0.1 to 1.0 $\mu$m, the infrared rays with a wavelength of about 8 to 12 $\mu$m can not be sufficiently absorbed by a single layer film with the discussed thickness. Therefore, in order to improve the absorption quantity of the infrared rays, some measure is necessary.

Also, in order to increase the sensor sensitivity of the light detecting section 2, it is necessary to improve heat insulation of the light detecting section 2 from the substrate 1. For this purpose, it could be considered that the outputting sections 11 and 12 and the leg sections 3 and 4 are formed of material with a low thermal conductivity. Also, it could be considered that the outputting sections 11 and 12 and the leg sections 3 and 4 are made thin, narrow and long, so that these section have high thermal resistance. At this time, if the outputting sections 11 and 12 and the leg sections 3 and 4 are made thin, narrow and long too much, problems, occurs in relation to the strength of the outputting sections 11 and 12 and the leg sections 3 and 4.

SUMMARY OF THE INVENTION

The present invention is accomplished to solve the above problems. Therefore, an object of the present invention is to provide a sensor which has an excellent sensor sensitivity.

Also, another object of the present invention is to provide a sensor which can absorb incident light efficiently.

Also, still another object of the present invention is to provide a sensor having a light detecting section excellent in heat insulation.

It is also an object of the present invention to provide a sensor having a high strength structure.

In order to achieve an aspect of the present invention, an infrared sensor of a non-cooling type has a bridge structure, the sensor compressing a substrate, a light detecting section spaced from the substrate supported on the substrate by leg sections, a microlens provided above the light detecting section, and an area of the light detecting section to which infrared rays collected by the microlens are irradiated is equal to or less than ½ of a whole area which is spaced from the substrate. It is desirable to additionally provide a reinforcement step along a longitudinal direction of the leg sections.

Also, in order to achieve another aspect of the present invention, an infrared sensor having a bridge structure comprises; a substrate a light detecting section spaced from the substrate and having a resonance structure in which infrared rays passing through the light detecting section are reflected and re-inputted to the light detecting section, a microlens having characteristics to collect incident infrared rays and to output the collected infrared rays to the light detecting section in a perpendicular direction thereto. It is desirable to provide the microlens spaced from the light detecting section. Also, it is desirable that the resonance structure include an infrared ray reflecting section under the light detecting section to reflect the infrared rays which passed the light detecting section.

In this manner, the sensor element includes the light detecting section spaced from the substrate, and has the area equal to or less than ½ of the whole area of the sensor element spaced from the substrate, or the bridge structure, for detecting incident light. Outputting sections are formed to be spaced from the substrate in the periphery section of the light detecting section, and leg sections are connected to the outputting sections to support the light detecting section. The detecting result by the light detecting section is connected to a processing circuit on the substrate by a wiring section. The sensor element may include the microlens section spaced from the light detecting section, for collecting and outputting the incident light to the light detecting section. Thus, the light detecting section can be made small.

Also, the microlens section collects and outputs the incident light to the light detecting section as a substantially parallel light.

The sensor may preferably include the infrared ray refelecting a reflecting film under the light detecting section. In this case, it is desirable that a distance between the light detecting section and the reflecting film is substantially equal to $1/\lambda$ ($\lambda$ is a central wavelength of the incident light). At such distance the light detecting section can effectively absorb the incident light.

The microlens section may preferably be composed of a lens substrate which can transmit the incident light, and a lens provided on the lens substrate to collect the incident light.

The microlens section may preferably have a first curved surface to collect the incident light to be inputted in parallel, and a second curved surface to output the collected light substantially as a parallel light. In this case, it is desirable that a radius of curvature of the first curved surface is equal to or larger than that of the second curved surface.

The microlens section may preferably have a laminate structure of a plurality of layers, in which an upper surface of the uppermost layer of the laminate structure is the first curved surface, and a bottom surface of the lowermost layer of the laminate structure is the second curved surface.

The microlens section may preferably be composed of a refracting layer having the first and second curved surfaces, and a lens substrate connected to the refracting layer, and having a curved surface corresponding to the second curved surface and a flat surface opposing to the corresponding curved surface.

An area of a region corresponding to the second curved surface of the microlens section is desirably equal to or less than ¼ of an area of a region corresponding to the first curved surface of the microlens section. Thus, the light detecting section can be made small.

Each outputting section of the wiring section is arranged to surround the light detecting section by at least ½ turn. Thus, the outputting sections can be elongated and the heat isolation of the light detecting section can be improved.

It is desirable that reinforcement sections are formed in the outputting section and leg section of the wiring section. Thus, the outputting section and the leg section can have strength even if they are made thin and long.

If a reinforcement section is formed in at least a part of a peripheral section of the light detecting section, the light detecting section can be made thin so that the increase of the sensor sensitivity and response speed can be accomplished.

The sensor element is an infrared sensor element, the incident light is an infrared ray, and a pattern composed of a material having a resistivity in a range of 0.5 Ωcm to 0.05 Ωcm is formed on the light detecting section. In this case, because the light detecting section can be made small, a material having a large temperature coefficient can be used for the light detecting section of the infrared sensor even though the material has a high resistivity.

DETAILED DESCRIPTION OF THE PREFERRED EMBODIMENTS

A non-cooling type sensor of the present invention will be described below in detail using an infrared sensor as an example, with reference to the attached drawings.

The infrared sensor according to the first preferred embodiment of the present invention will be described. The infrared sensor according to the first embodiment of the present invention is structured in such a manner that a plurality of infrared ray sensor elements are arranged in a two-dimensional matrix.

Figure 1:
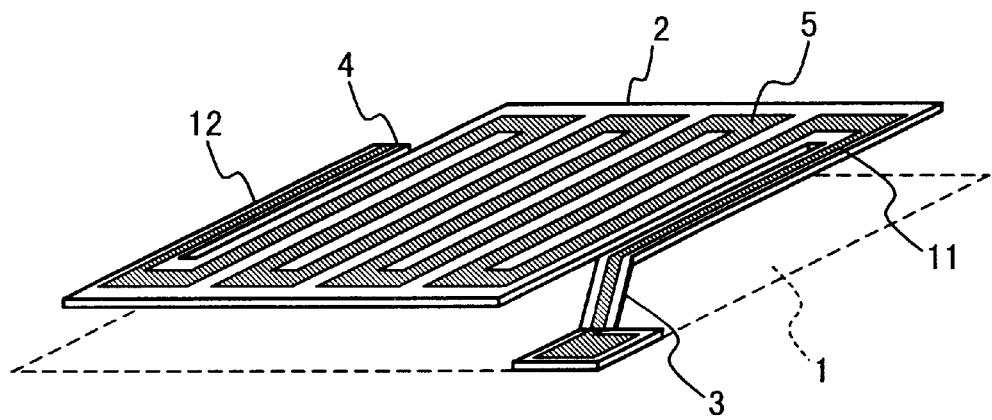
FIG. 1 is a perspective view of a conventional sensor element.
Figure 2:
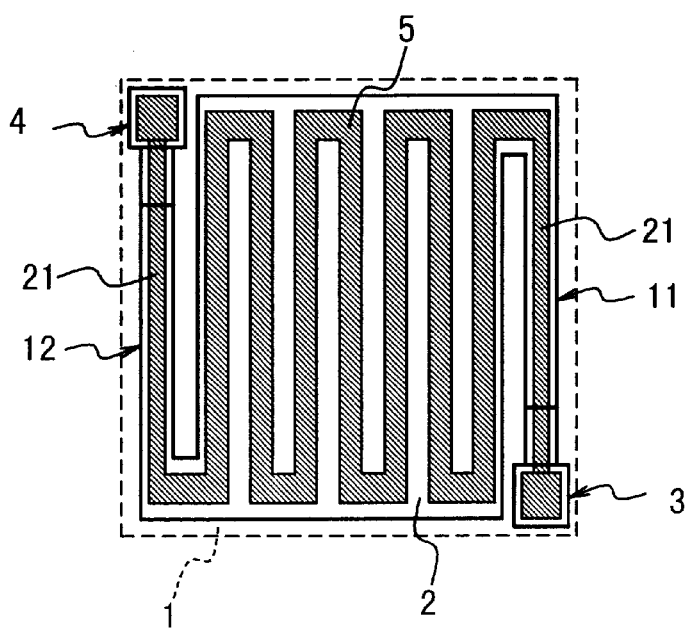
FIG. 2 is a plan view of the conventional sensor element.
Figure 3:
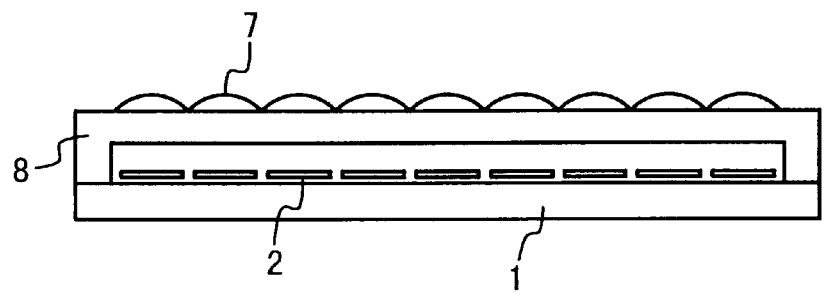
FIG. 3 is a cross sectional view of an infrared sensor to which a sensor element according to a first embodiment of the present invention is applied.
Figure 4:
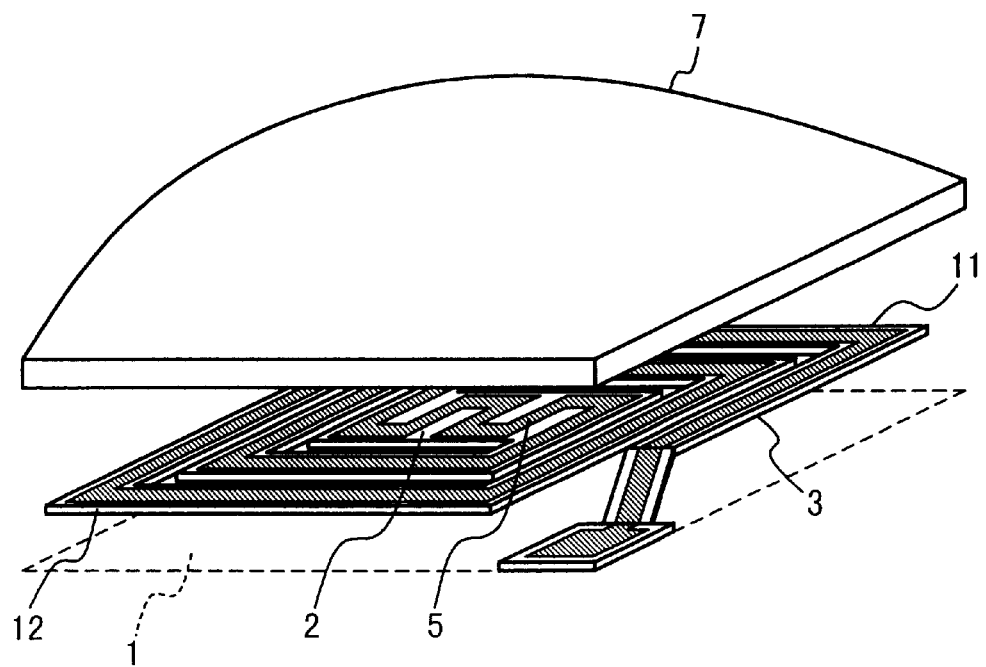
FIG. 4 is a perspective view of the sensor element according to a first embodiment of the present invention.

FIG. 3 is a cross sectional view of the infrared sensor according to the first embodiment of the present invention. Referring to FIG. 3, and FIG. 4 a light detecting section 2 of the infrared sensor element is provided above a semiconductor substrate 1 to be spaced from the substrate 1. Thus, the light detecting section 2 is thermally insulated from the substrate 1.

A microlens section is composed of a microlens 7 and a microlens substrate 8. The microlens 7 corresponding to each of the light detecting sections 2 is mounted on the lens substrate 8. The microlens 7 and the lens substrate 8 are formed of the material which can transmit the infrared rays, such as semiconductor materials of Ge, Si, InP, ZnSe, and CdSe or resin materials such as plastic. The microlens 7 and the lens substrate 8 may be formed of different materials. Also, they may be formed of the same material as a unit. Also, the microlens 7 is shown as a convex type in the figure. However, the microlens 7 may be formed to have the shape of Fresnel lens.

A concave section is formed in the lens substrate 8 on the opposite side to the microlens 7. The lens substrate 8 on which the microlenses 7 are mounted is installed on the substrate 1. And particularly, the substrate 1 and the lens substrate 8 are joined and sealed such that the concave section of the lens substrate 8 is set to a vacuum state. Thus, the light detecting section 2 is insulated from the lens section in heat.

FIG. 4 is a perspective view of the infrared sensor element of the infrared sensor according to the first embodiment of the present invention. The infrared sensor is of a bolometer type in which the change of the resistance value by heat of the incident infrared rays is outputted as an electric signal. The infrared sensor element according to the first embodiment will be described with reference to FIG. 4.

In FIG. 4, the infrared sensor element in the first embodiment is composed of the infrared light detecting section 2 provided on the semiconductor substrate 1 to be spaced from the substrate 1 and the microlens 7 of the microlens section provided above the light detecting section 2 in a spaced manner 2. In this way, the light detecting section 2 of a bridge structure is formed.

The microlens 7 is provided to cover the whole area of the infrared sensor element. By this, the microlens 7 can collect all the infrared rays to be incident to the infrared sensor element area. A reflection preventing film which is composed of a diamond like carbon is formed on the surface of the microlens 7 by a sputtering method and a CVD method, for example.

The light detecting section 2 is composed of silicon nitride and/or silicon oxide. In order to decrease the thermal capacity of the light detecting section 2 as much as possible, the light detecting section 2 is formed to have a thin structure. In this way, the sensor sensitivity and response speed of the light detecting section 2 can be improved.

A sensor resistor pattern 5 which changes resistance depending upon temperature is formed on the surface of the light detecting section 2. When the infrared rays are inputted thereto, the resistance value of the sensor resistor pattern 5 changes due to the heat of the infrared rays and the change is detected. Therefore, it is desirable that the material which has a high temperature coefficient is used as the material of sensor resistor pattern 5. In the first embodiment, metal such as titanium or semiconductor such as vanadium oxide is used for the material of the sensor resistor pattern 5.

Figure 5:
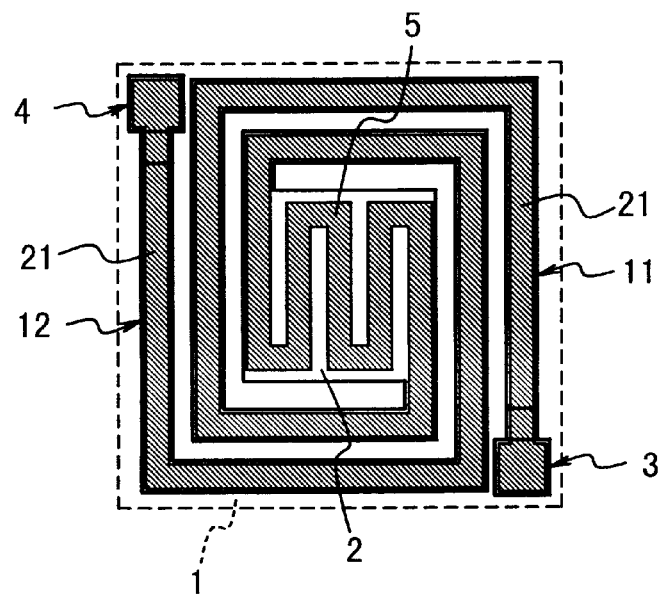
FIG. 5 is a plan view of the sensor element according to the first embodiment of the present invention.

A circuit section (not shown) is provided on the surface of the substrate 1 under the light detecting section 2 to process a signal from the light detecting section 2. As shown in FIG. 5, a wiring section is provided around the light detecting section 2. The wiring section is composed of the outputting sections 11 and 12 and leg sections 3 and 4 to connect a detection result by the light detecting section 2 to the circuit section of the substrate 1. The outputting sections 11 and 12 and the leg sections 3 and 4 are formed to surround the light detecting section 2. In this way, the light detecting section 2, the outputting section 11 and 12 and the leg sections 3 and 4 are formed in a rectangular form.

As shown in FIG. 5, the patterns 21 which are formed of the same material as the sensor resistor pattern 5 in the light detecting section 2 are formed on the outputting sections 11 and 12 and the leg sections 3 and 4. By this, the light detecting section 2 and the circuit section which is formed on the substrate 1 are electrically connected through the outputting sections 11 and 12 and the leg sections 3 and 4.

It should be noted that a circuit section need not be provided under the light detecting section 2 but may be collectively provided in another area for the plurality of infrared ray sensor elements. In this case, a wiring pattern from the leg sections 3 and 4 to the circuit section is formed on the substrate 1.

Figure 14:
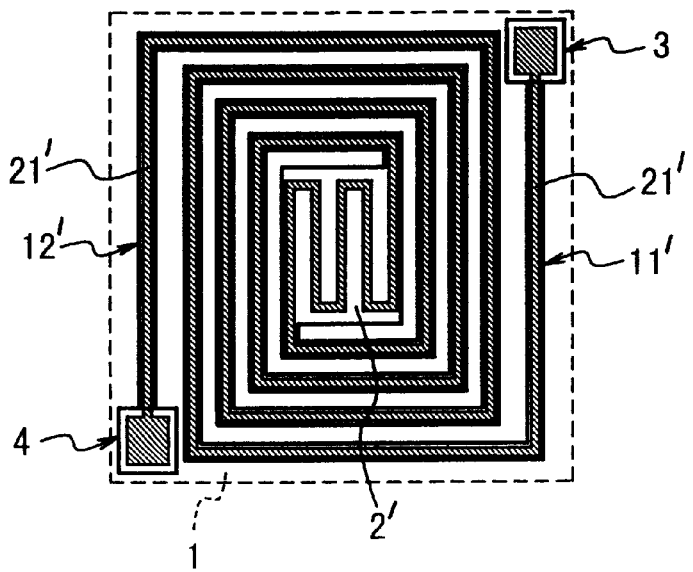
FIG. 14 is a plan view of another example of the sensor element according to the first embodiment of the present invention.

Also, if a light detecting section 2' can be made smaller, it becomes possible to elongate the wiring section which is composed of the outputting sections 11' and 12' and the leg sections 3 and 4, such as shown in FIG. 14. As a result, the heat insulation of the light detecting section 2' from the substrate 1 can be more improved.

Also, the patterns of the outputting sections 11 and 12 and the leg sections 3 and 4 may be formed of metal material. In this case, the heat insulation of the light detecting section 2 is low, compared with the case where the patterns 8 are formed of the same material as that of the sensor resistor pattern 5. However, when the wiring section which is composed of the outputting sections 11 and 12 and the leg sections 3 and 4 is elongated, the response speed can be improved.

As above mentioned, the of the present invention is the infrared sensor of the non-cooling type having the bridge structure in which the light detecting section 2 is spaced from the substrate 1.

The infrared rays which are incident on the area of the infrared sensor element are collected by the microlens 7 and are irradiated to the light detecting section 2. Thus, the area of the light detecting section 2 can be made small.

Figure 6:
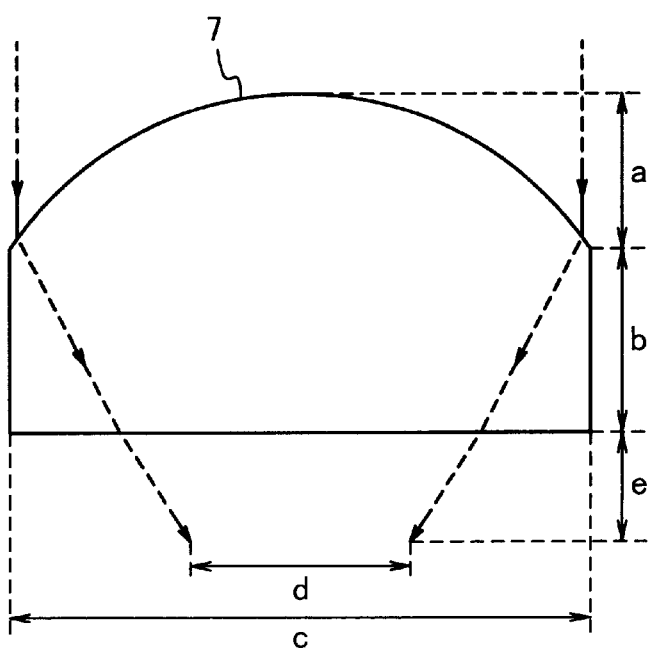
FIG. 6 is a cross sectional view of a microlens used in the sensor element according to the first embodiment of the present invention.

FIG. 6 shows a typical shape of the microlens 7. For example, the microlens 7 is formed to be a=1 μm, b=200 μm, c=50 μm, d=25 μm and e=2 μm as the respective sizes. It is necessary to form the lens spherical surface by a convex forming process of about 1 μm. This is accomplished by a gray tone mask method in a usual semiconductor photolithography process. In this case, using the microlens of 50 μm×50 μm, the infrared rays are collected to an area of 25 μm×25 μm, that is, to an area of the light detecting section 2 which is ¼ of the area of the infrared sensor element.

As shown in FIG. 5, the area of the light detecting section 2 is set to be ½ of the portion of the sensor element which is spaced from the substrate 1, that is, ½ of the rectangular area which is composed of the area of the light detecting section 2, the area of the outputting section 11 and 12 and the area of the leg sections 3 and 4.

In this way, as seen from FIGS. 5 and 6, according to the present invention, since the area of the light detecting section 2 which is irradiated by the infrared rays collected by the microlens 7 can be set to be as small as equal to or less than ½ of a total area of the wiring section and the light detecting section 2, the absorption quantity of the infrared rays by the light detecting section 2 can be kept in a good state.

Also, as seen from FIG. 5, the outputting sections 11 and 12 and the leg sections 3 and 4 are provided around the light detecting section 2 to surround the light detecting section 2. Thus, the outputting sections 11 and 12 and the leg sections 3 and 4 can be made long without changing the whole size of the rectangular form size. Each of the outputting sections 11 and 12 desirably surrounds the light detecting section by at least ½ turn or the length of each outputting section is desirably from 50 μm to 300 μm. In the first embodiment, each outputting section extends one full turn around the light detecting section 2 and the length is about 100 (=25×4) μm. Therefore, the heat insulation of the light detecting section 2 can be improved. Thus, it becomes possible to improve the sensor sensitivity in the structure.

Also, according to the present invention, the sensor sensitivity can be effectively improved from the viewpoint of the electric characteristic, as described below.

Figure 7:
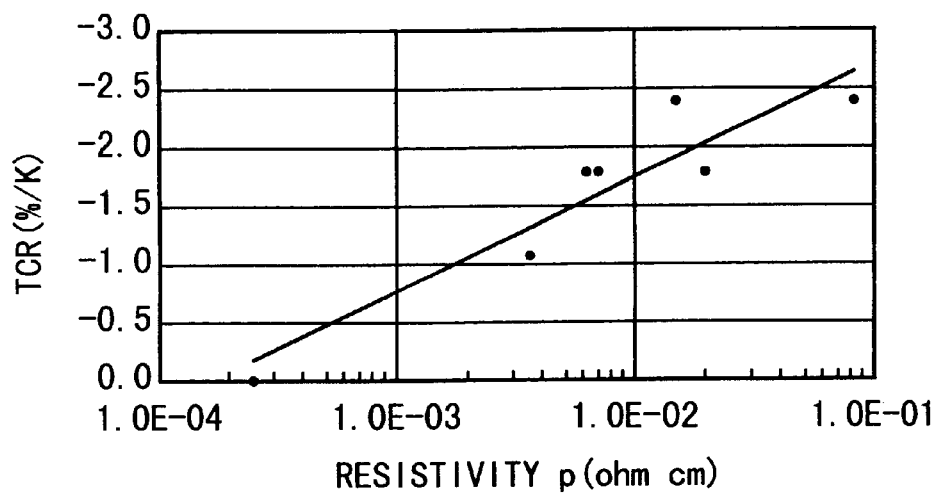
FIG. 7 is a graph showing a relation of temperature coefficient and resistivity of material of a sensor resistor pattern.

The most important characteristic of the material of the sensor resistor pattern 5 are a high temperature coefficient (TCR) of the resistor and small characteristics the noise. The practically important noise characteristic of the noises relating to the material of the sensor resistor pattern 5 are a resistance noise and 1/f noise. Because the resistance noise is determined based on the resistance value of the sensor resistor pattern 5, the resistivity of the material of the sensor resistor pattern 5 is required to be as small as possible. However, as shown in FIG. 7, the temperature coefficient (TCR) and resistivity of the material of the sensor resistor pattern are in a trade off relation.

For this reason, in the present invention, the incident infrared rays are collected by the microlens 7 and are irradiated to the light detecting section 2. Thus, because it is possible to decrease the area of the light detecting section 2 in this manner, it is also possible to shorten the wiring length of the sensor resistor pattern 5. Therefore, even if the resistivity of the material of the sensor resistor pattern 5 is high it is still possible to suppress the resistance value of the sensor resistor pattern to be low. It is desirable that the material of the sensor resistor pattern 5 has a resistivity in a range of 0.05 Ωcm to 0.5 Ωcm. In this way, in the infrared sensor of the present invention, because the material with a high resistivity can be used for the sensor resistor pattern 5, the material with a high temperature coefficient (TCR) of the resistance can be used as the material of the sensor resistor pattern 5, so that the sensor sensitivity can be improved.

In the first embodiment, vanadium oxide (VOx) is preferably used as the material of the sensor resistor pattern 5 and preferably has a resistivity of 0.1 Ωcm. Because the resistivity of vanadium oxide (VOx) can be easily changed by changing the composition thereof (VOx), the sensor resistor pattern 5 which has a desired resistance value can be formed based on the shape of the sensor resistor pattern 5 of the light detecting section 2.

As described above, according to the first embodiment, the area of the light detecting section 2 can be set to be equal to or smaller than ¼ of the whole area of the sensor element. Therefore, when the infrared rays are input thereto, the light detecting section 2 in the first embodiment undergoes a temperature change equal to or more than 4 times, compared with the conventional light detecting section which has the same area as the whole area of the sensor element. This means that the sensor sensitivity is increased 4 times or more in the light detecting section 2 in the first embodiment, compared with the conventional light detecting section. Also, if the resistivity of the material of the sensor resistor pattern in the conventional sensor element is 0.01 Ωcm, the temperature coefficient corresponding to the resistivity is about −1.75%/K. On the contrary, in the first embodiment, the material having a resistivity of 0.1 Ωcm can be used. The temperature coefficient in this case is about −2.8%/K. Therefore, it could be expected that the sensor sensitivity can be improved about an additional 1.6 times in comparison to the conventional sensor considering both the temperature change and the resistivity. Thus, the overall sensor sensitivity according to the first embodiment could be increased 6.4 times or above. Also, at this time, if the area of the light detecting section 2 is set to be ½ of the total area of the light detecting section 2 and the wiring section, the heat isolation of the light detecting section 2 from the substrate 1 can be improved so that the sensor sensitivity can be further increased.

Next, the infrared sensor according to the second preferred embodiment of the present invention will be described.

Figure 8:
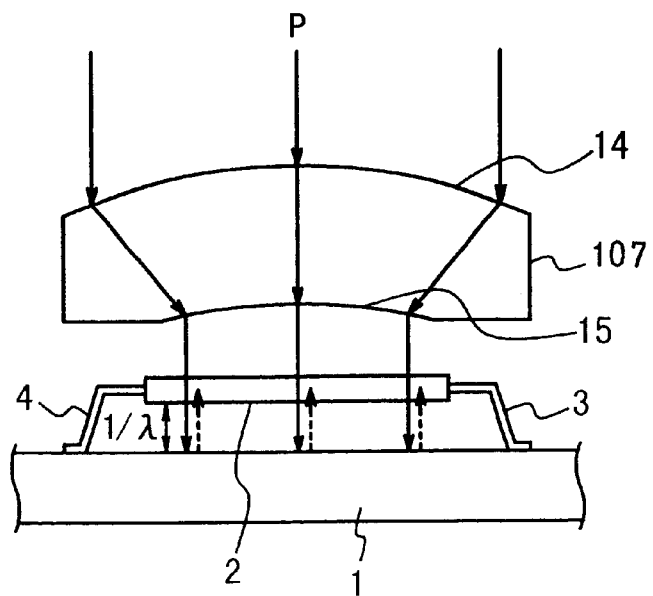
FIG. 8 is a cross sectional view of the sensor element according to a second embodiment of the present invention.

FIG. 8 is a cross sectional view which shows the structure of the infrared sensor according to the second preferred embodiment of the present invention. Referring to FIG. 8, the infrared sensor in the second embodiment has the bridge structure of the light detecting section 2, similar to the infrared sensor in the first embodiment which is shown in FIG. 4. In addition, an infrared reflecting film 13 is formed. Also, the microlens 107 for the collection of the infrared rays is formed to have a first curved convex surface 14 on the side of the infrared source and to have a second curved concave surface 15 on the opposite side to the infrared source.

Figure 9:
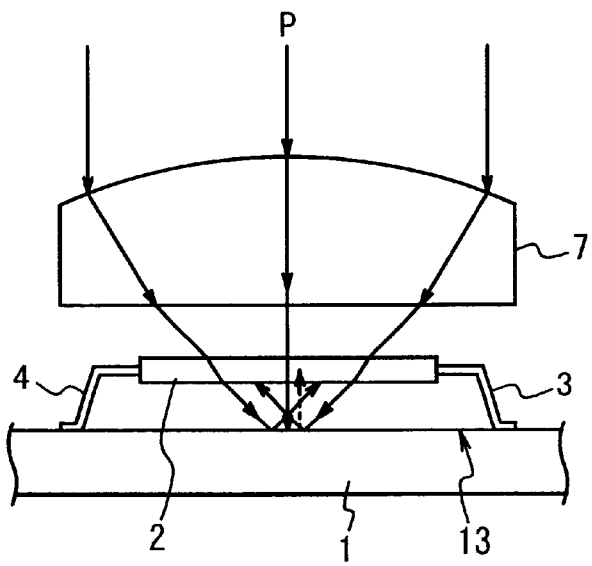
FIG. 9 is a cross section view of the sensor element to explain the operation of the sensor element according to the first embodiment of the present invention.

In the first embodiment, as shown in FIG. 9, because a second curved surface, such as the second curved surface 15' is not formed in the microlens 7, the infrared rays which are collected by the microlens 7 are incident to the light detecting section 2 diagonally to have an angle from the direction perpendicular to the light detecting section 2. As a result, the infrared rays are diagonally reflected by the reflecting film 13. Therefore, even if the reflecting film 13 is provided, a sufficient increase in the absorption quantity of the infrared rays may not be accomplished by the light detecting section 2.

Referring to FIG. 8, in the infrared sensor in the second embodiment, the incident infrared rays are refracted by the first curved surface 14 of the microlens 107 composed of Ge in the center direction of the microlens 107 and are collected. The collected infrared rays are then outputted to the light detecting section 2 in the substantially perpendicular direction to the light detecting section 2 in the second curved surface 15 of the microlens 107. In this way, the radius of curvature of first curved surface 14 becomes equal to or larger than the radius of curvature of the second curved surface 15.

Also, in the infrared sensor element in the second embodiment, the reflecting film 13 is formed on the surface of the substrate 1 just as in the first embodiment. The light detecting section 2 is formed to have a distance of about $1/\lambda$ from the reflecting film 13 ($\lambda$: the central wavelength of the infrared rays which are incident to the light detecting section 2). Therefore, the infrared rays passes through the light detecting section 2 and are incident to the reflecting film 13 in a substantially perpendicular direction to the light detecting section 2. Then, the infrared rays are reflected by the reflecting film 13 and then are incident to the light detecting section 2 once again. That is, the so-called resonance structure is formed.

In this way, because the infrared ray reflecting film 13 is formed on the surface of the substrate 1, the reflection of the infrared rays which passes through the light detecting section 2 is effectively performed so that the absorption quantity of the infrared rays by the light detecting section 2 is improved to a greater extent than in the first embodiment. Therefore, the sensor sensitivity of the light detecting section 2 can be improved. It should be noted that in order to accomplish a thermal insulation, the ambience of the light detecting section 2 is set in the vacuum state as in the first embodiment.

Figure 10:
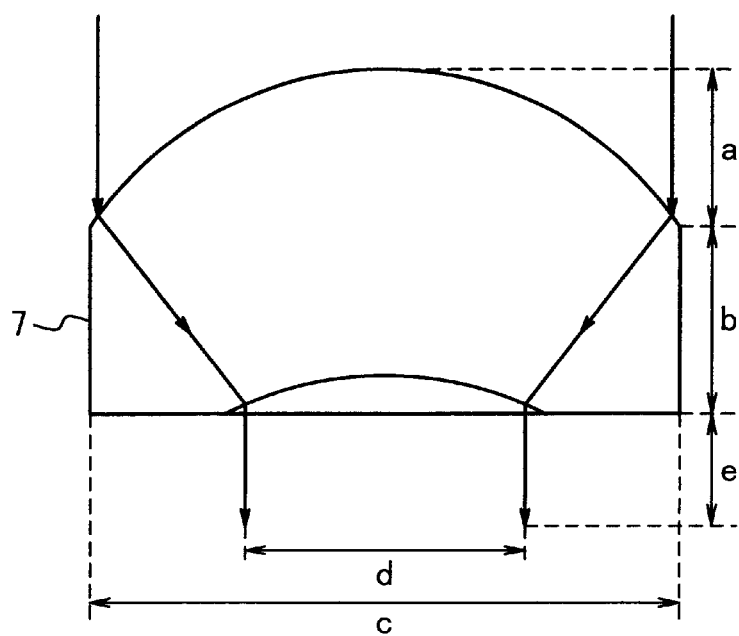
FIG. 10 is a cross sectional view of a microlens used in the sensor element according to the second embodiment of the present invention.

FIG. 10 shows a typical shape of the microlens 107. For example, the microlens 107 is formed to be a=1 $\mu$m, b=200 $\mu$m, c=50 $\mu$m, d=25 $\mu$m and e=2 $\mu$m as the respective sizes. It is necessary to form the lens spherical surface by a convex forming process of about 1 $\mu$m. This is accompanied by a gray tone mask method in a usual semiconductor photolithography process. In this case, using the microlens of 50 $\mu$m×50 $\mu$m, the infrared rays are collected to the area of 25 $\mu$m×25 $\mu$m, that is, to an area of the light detecting section 2 which is ¼ of the area of the infrared sensor element.

As described above, because the microlens 107 is designed in such a manner that the perpendicularly incident infrared rays P are collected by the microlens 7 and the collected infrared rays are output in parallel, all of the infrared rays P which are incident to the microlens 107 are perpendicularly irradiated to the light detecting section 2. Therefore, the absorption of the infrared rays by the light detecting section 2 can be increased without degradation of the resonance characteristic between the light detecting section 2 and the substrate 1 or the infrared ray reflecting film 13.

Next, the infrared sensor according to the third preferred embodiment of the present invention will be described. The infrared sensor in the third embodiment of the present invention is the same as the second embodiment in the basic structure. The difference between the second embodiment and the third embodiment is in the structure of the microlens 207 thereof. Therefore, only the microlens 207 will be described.

Figure 11:
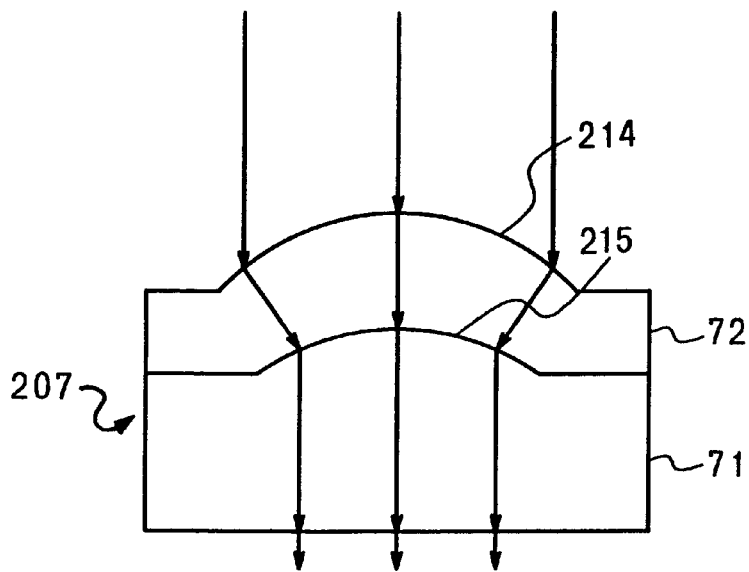
FIG. 11 is a cross sectional view of the sensor element according to a third embodiment of the present invention.

FIG. 11 is a diagram which shows the structure of the microlens 7 which is used in the infrared sensor according to the third embodiment of the present invention. Referring to FIG. 11, the microlens 7 has a laminate structure of a first film 71 and a second film 72. The first film 71 is composed of Ge which can transmit the infrared rays and has a convex portion in the area corresponding to the light detecting section 2. The first film 71 has the film thickness of a few hundreds of micrometers in the flat section. The second film 72 is formed of resin material such as polyethylene and has the film thickness from several to tens of micrometers. The second film 72 is formed along the surface of the first film 71. The refractive index of the polyethylene used for the film 72 is about 1.5 and the refractive index of the Ge used for the film 71 is about 2. In this way, the refractive index of the first film 71 is larger than that of the second film 72.

In the structure of the third embodiment, when the refractive index of the substance around the microlens 207, the refractive indexes of the first and second films of the microlens 207, the radiuses of curvature of the first and second curved surfaces 214 and 215 are appropriately selected, it is possible to collect the incident infrared rays in a desired area and to output to the light detecting section in a perpendicular direction as the parallel light.

In this way, in the third embodiment, because the radius of curvature of the first curved surface 214 can be made smaller than the radius of curvature of the first curved surface 14 in the second embodiment, the infrared rays can be confined into a smaller area. In this way, the sensor sensitivity of the light detecting section 2 can be further improved.

Figure 12:
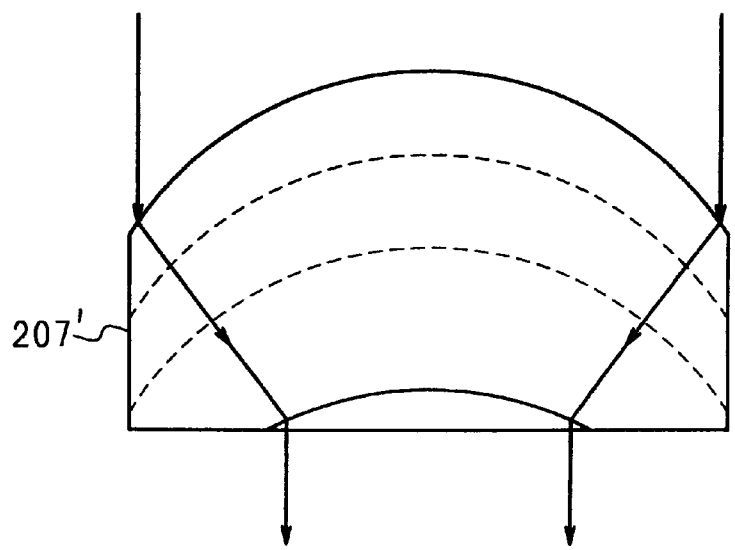
FIG. 12 is a cross sectional view of the sensor element according to a modification of the third embodiment of the present invention.

Next, a modification of the third embodiment will be described with reference to FIG. 12. In the modification, the microlens 207 is formed to have a multi-layer structure. In this case, like the third embodiment, when the refractive index of the substance around the microlens 207, the refractive indexes of the first and second films of the microlens 7, and the radiuses of curvature of the first and second curved surfaces 14 and 15 are appropriately selected, it is possible to collect the incident infrared rays in a desired area and to output to the light detecting section in a perpendicular direction as the parallel light.

Next, the infrared sensor according to the fourth preferred embodiment of the present invention will be described. It is possible to apply this embodiment to the first through to third embodiments.

Figure 13:
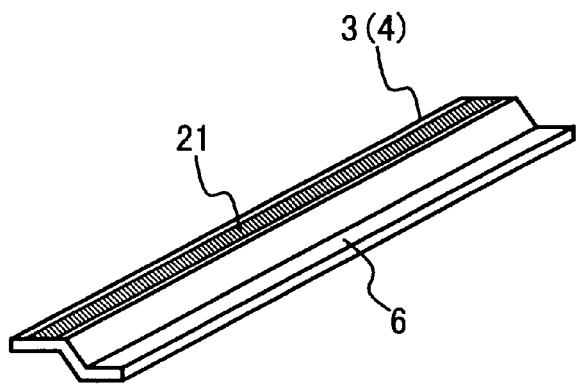
FIG. 13 is a perspective view of a part of a reinforcement section for the outputting section used in the sensor element according to a fourth embodiment of the present invention.

FIG. 13 is a perspective view illustrating a reinforcement step 6 which is provided along the longitudinal direction of the outputting sections 11 and 12 and/or on the either side or both sides in the infrared sensor according to fourth preferred embodiment of the present invention.

In the infrared sensor of the present invention, it is necessary that the outputting sections 11 and 12 and the leg sections 3 and 4 are made thin, narrow and long so as to increase the thermal resistance, so that the heat insulation of the light detecting section 2 is increased to improve the sensor sensitivity of the light detecting section 2. However, when the outputting sections 11 and 12 and the leg sections 3 and 4 are merely made thin, narrow and long, the infrared sensor element becomes weak mechanically, so that there is a possibility that the infrared sensor element is damaged. Therefore, the reinforcement step 6 is formed along the longitudinal direction on the side of the one end of the outputting sections 11 and 12 and leg sections 3 and 4.

It should be noted that the reinforcement step 6 may be provided for both sides of the outputting sections 11 and 12 and leg sections 3 and 4 along the longitudinal direction. Also, the reinforcement step 6 may be provided at least partly around the light detecting section 2. In this case, the light detecting section 2 can be made thin so that it becomes possible to decrease the thermal capacity of the light detecting section 2. In this way, the outputting sections 11 and 12 and leg sections 3 and 4 can be made to have a high strength structure. It is possible to increase the structural strength by equal to or more than 1 digit higher than the conventional outputting sections and the leg sections in which simple plates are formed.

The present invention can be applied to sensors of all non-cooling types such as a pyroelectric type and a thermocouple type, in addition to the infrared sensor of the bolometer type which is described above.

As described above, according to a non-cooling type sensor of the present invention, the microlens is provided above the light detecting section, and the incident light which is collected by the microlens is irradiated to the area of the light detecting section. Therefore, the area of the light detecting section is designed to become equal to or less than ½ of the area of both of the light detecting section and the wiring section which are spaced from the substrate. As a result, the sensor sensitivity of the light detecting section can be improved by decreasing the area of the light detecting section. Also, when the incident light being sensed is infrared rays, the thermal capacity of the light detecting section can be effectively restrained and the heat insulation of the light detecting section can be made high by elongating the outputting sections and the leg sections.

Also, in the present invention, the microlens is used which has the characteristic to collect incident infrared rays and to irradiate the collected infrared rays to the light detecting section in the perpendicular direction. Therefore, the fill factor can be improved without increasing thermal capacity of the light detecting section.

Also, the bridge structure is adopted such that the light detecting section is spaced from the substrate. Also, the resonance structure is adopted in which the infrared rays which pass the light detecting section perpendicularly approximately are reflected by the reflecting film and are re-inputted to the light detecting section. Therefore, the absorption of the infrared rays by the light detecting section can be improved.

Also, because the light detecting section with a small area can be realized, materials with high resistivity can be used for the sensor resistor pattern. Because the temperature coefficient of the material with high resistivity is generally large, the sensor sensitivity of the light detecting section can be improved.

In this way, according to the present invention, because infrared rays in the light detecting section are efficiently input according to in the invention, the sensor sensitivity can be improved.

Although there have been described above what are considered to be the presently preferred embodiments of the invention, it will be understood by persons skilled in the art that variations and modifications may be made thereto without departing from the gist, spirit or essence of the invention. The scope of the invention is indicated by the appended claims.

What is claimed is:

1. An infrared sensor having a bridge structure, the sensor comprising: a substrate, a light detecting section spaced from said substrate and having a resonance structure in which infrared rays passing through the light detecting section are reflected and re-input to the light detecting section, and a microlens having characteristics to collect incident infrared rays and to output the collected infrared rays to the light detecting section in a perpendicular direction thereto.

2. An infrared sensor according to claim 1, wherein the microlens is provided spaced from the light detecting section.

3. An infrared sensor according to claim 1, wherein an infrared ray reflecting section of said resonance structure is provided under the light detecting section to reflect the infrared rays which have passed through the light detecting section.

4. An infrared sensor according to claim 1, further including outputting sections disposed in a periphery of the light detecting section for outputting a detection result of the light detecting section.

5. An infrared sensor according to claim 4, wherein each said outputting section surrounds said light detecting section by at least ½ turn.

6. An infrared sensor according to claim 3, wherein a reflecting surface of said infrared ray reflecting section is spaced from said light detecting section by a distance $1/\lambda$, where $\lambda$ is a central wavelength of the incident infrared rays.

7. An infrared sensor according to claim 1, wherein said microlens includes a lens substrate for transmitting the incident infrared rays and a lens provided on the lens substrate to collect the incident infrared rays.

8. An infrared sensor according to claim 1, wherein said microlens includes a first curved surface to collect the incident infrared rays substantially in parallel, and a second curved surface to output the collected infrared rays as a substantially parallel light.

9. An infrared sensor according to claim 8, wherein a radius of curvature of said first curved surface is at least as large as a radius of curvature of said second curved surface.

10. An infrared sensor having a bridge structure, the sensor comprising:
    a substrate, a light detecting section spaced from said substrate and having a resonance structure in which infrared rays passing through the light detecting section are reflected and re-input to the light detecting section, and a microlens having characteristics to collect incident infrared rays and to output the collected infrared rays to the light detecting section in a perpendicular direction thereto,
    said microlens including a first curved surface to collect the incident infrared rays substantially in parallel, and a second curved surface to output the collected infrared rays as a substantially parallel light, and
    said microlens has a laminate structure of a plurality of layers, an upper surface of an uppermost layer of said laminate structure is said first curved surface, and a bottom surface of a lowermost layer of said laminate structure is said second curved surface.

11. An infrared sensor according to claim 10, wherein the microlens is provided spaced from the light detecting section.

12. An infrared sensor according to claim 10, wherein an infrared ray reflecting section of said resonance structure is provided under the light reflecting section to reflect the infrared rays which have passed through the light detecting section to reflect the infrared rays which have passed through the light detecting section.

13. An infrared sensor having a bridge structure, the sensor comprising:
    a substrate, a light detecting section spaced from said substrate and having a resonance structure in which infrared rays passing through the light detecting section are reflected and re-input to the light detecting section, and a microlens having characteristics to collect incident infrared rays and to output the collected infrared rays to the light detecting section in a perpendicular direction thereto, said microlens including a first curved surface to collect the incident infrared rays substantially in parallel, and a second curved surface to output the collected infrared rays as a substantially parallel light, and said microlens including a refracting layer having said first and second curved surfaces, and a lens substrate connected to the refracting layer.

14. An infrared sensor according to claim 13, wherein said lens substrate has a curved surface corresponding to said second curved surface for engaging therewith, and a flat surface opposite to said substrate curved surface for outputting the collected infrared rays to the light detecting section.

15. An infrared sensor according to claim 13, wherein said refracting layer and said lens substrate have different refractive indexes.

16. An infrared sensor according to claim 13, wherein the microlens is provided spaced from the light detecting section.

17. An infrared sensor according to claim 13, wherein an infrared ray reflecting section of said resonance structure is provided under the light reflecting section to reflect the infrared rays which have passed through the light detecting section to reflect the infrared rays which have passed through the light detecting section.

18. An infrared sensor of a non-cooling type and having a bridge structure, the sensor comprising: a substrate, a light detecting section spaced from said substrate and supported on the substrate by leg sections, and a microlens provided above the light detecting section, an area of the light detecting section to which infrared rays collected by the microlens are irradiated being equal to or less than ½ of a whole area which is spaced from the substrate.

19. An infrared sensor according to claim 4, further including a reinforcement step provided along a longitudinal direction of at least one of the leg sections.

20. An infrared sensor according to claim 18, further including outputting sections disposed in a periphery of the light detecting section for outputting a detection result of the light detecting section.

21. An infrared sensor according to claim 20, wherein each said outputting section surrounds said light detecting section by at least ½ turn.

22. An infrared sensor according to claim 18, wherein said microlens includes a lens substrate for transmitting the incident infrared rays and a lens provided on the lens substrate to collect the incident infrared rays.

23. An infrared sensor according to claim 18, wherein said microlens includes a first curved surface to collect the incident infrared rays substantially in parallel, and a second curved surface to output the collected infrared rays as a substantially parallel light.

24. An infrared sensor according to claim 23, wherein said microlens has a laminate structure of a plurality of layers, an upper surface of an uppermost layer of said laminate structure is said first curved surface, and a bottom surface of a lowermost layer of said laminate structure is said second curved surface.

25. An infrared sensor according to claim 23, wherein said microlens includes a refracting layer having said first and second curved surfaces, and a lens substrate connected to the refracting layer.

26. An infrared sensor according to claim 25, wherein said lens substrate has a curved surface corresponding to said second curved surface for engaging therewith, and a flat surface opposite to said substrate curved surface for outputting the collected infrared rays to the light detecting section.

27. An infrared sensor according to claim 25, wherein said refracting layer and said lens substrate have different refractive indexes.

28. An infrared sensor according to claim 18, wherein said light detecting section includes a resist pattern composed of a material having a resistivity in a range of 0.5–0.05 Ωcm.

29. An infrared sensor having a bridge structure, the sensor comprising:

a substrate, a light detecting section spaced from said substrate and having a resonance structure in which infrared rays passing through the light detecting section are reflected and re-input to the light detecting section, and a microlens having characteristics to collect incident infrared rays and to output the collected infrared rays to the light detecting section in a perpendicular direction thereto, said light detecting section including a resist pattern composed of a material having a resistivity in a range of 0.5–0.05 Ωcm.

30. An infrared sensor according to claim 29, wherein the microlens is provided spaced from the light detecting section.

31. An infrared sensor according to claim 29, wherein an infrared ray reflecting section of said resonance structure is provided under the light reflecting section to reflect the infrared rays which have passed through the light detecting section to reflect the infrared rays which have passed through the light detecting section.

* * * * *

UNITED STATES PATENT AND TRADEMARK OFFICE
CERTIFICATE OF CORRECTION

PATENT NO. : 6,218,667 B1
DATED : April 17, 2001
INVENTOR(S) : Ken-Ichi Nonaka, Seiichi Yokoyama, Toshifumi Suzuki It is certified that error appears in the above-identified patent and that said Letters Patent is hereby corrected as shown below:

Column 2,
Line numbered between 26 and 27, change "decreasing of" to -- decreasing --;
Line 57, change "section" to -- sections --;
Line 60, after "problems" delete the comma; change "occurs" to -- occur --.

Column 3,
Line 10, change "compressing" to -- comprising --;
Line numbered between 21 and 22, change "comprises;" to -- comprises: --; after "substrate" insert a comma;
Line numbered between 32 and 33, change "passed" to -- have passed through --;
Line numbered between 38 and 39, change "periphery section" to -- periphery --;
Line 52, change "reflecting" to -- reflecting section, such as --.

Column 5,
Line numbered between 46 and 47, delete the period and change "And" to -- and --;
Line numbered between 49 and 50, before "insulated" insert -- also thermally --;
Line numbered between 50 and 51, delete "in heat";
Line 64, change "manner 2" to -- manner --.

Column 6,
Line numbered between 31 and 32, change "outputting section" to -- outputting sections --;
Lines 62-63, change "the of the present invention is the infrared sensor" to -- the infrared sensor of the present invention is --.

Column 7,
Line 14, after "be" insert -- no more than --;
Line 45, change "characteristic" to -- characteristics --;
Line 47, change "characteristics the noise" to -- noise characteristics --;
Line 64, after "high" insert a comma.

Column 8,
Line 10, delete "(VOx)";
Line 58, change "15" to -- 15, --.

UNITED STATES PATENT AND TRADEMARK OFFICE
CERTIFICATE OF CORRECTION

PATENT NO. : 6,218,667 B1
DATED : April 17, 2001
INVENTOR(S) : Ken-Ichi Nonaka, Seiichi Yokoyama, Toshifumi Suzuki It is certified that error appears in the above-identified patent and that said Letters Patent is hereby corrected as shown below:

Column 9,
Line 18, change "passes" to -- pass --;
Line numbered between 40 and 41, change "accompanied" to -- accomplished --;
Line numbered between 48 and 49, change "microlens 7" to -- microlens 107 --;
Line 67, change "7" to -- 207 --.

Column 10,
Line 2, change "7" to -- 207 --;
Line 18, after "207," insert -- and --;
Line numbered 32 and 33, change "207" to 207' --;
Line numbered 34 and 35, change "207" to 207 --;
Line numbered 43 and 44, change "through to" to -- through --.

Column 11,
Line 52, delete "in".

Column 13,
Line 38, change "claim 4" to -- claim 18 --.

Signed and Sealed this

Twenty-fifth Day of December, 2001

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,218,667 B1
DATED : April 17, 2001
INVENTOR(S) : Ken-Ichi Nonaka, Seiichi Yokoyama and Toshifumi Suzuki It is certified that error appears in the above-identified patent and that said Letters Patent is hereby corrected as shown below:

Column 2,
Line numbered between 26 and 27, change "decreasing of" to -- decreasing --;
Line 57, change "section" to -- sections --;
Line 60, after "problems" delete the comma; change "occurs" to -- occur --.

Column 3,
Line 10, change "compressing" to -- comprising --;
Line numbered between 21 and 22, change "comprises;" to -- comprises: --; after "substrate" insert a comma;
Line numbered between 32 and 33, change "passed" to -- have passed through --;
Line numbered between 38 and 39, change "periphery section" to -- periphery --;
Line 52, change "refelecting" to -- reflecting section, such as --.

Column 5,
Line numbered between 46 and 47, delete the period and change "And" to -- and --;
Line numbered between 49 and 50, before "insulated" insert -- also thermally --;
Line numbered between 50 and 51, delete "in heat";
Line 64, change "manner 2" to -- manner --.

Column 6,
Line numbered between 31 and 32, change "outputting section" to -- outputting sections --;
Lines 62-63, change "the of the present invention is the infrared sensor" to -- the infrared sensor of the present invention is --.

Column 7,
Line 14, after "be" insert -- no more than --;
Line 45, change "characteristic" to -- characteristics --;
Line 47, change "characteristics the noise" to -- noise characteristics --;
Line 64, after "high" insert a comma.

Column 8,
Line 10, delete "(VOx)";
Line 58, change "15'" to -- 15, --.

UNITED STATES PATENT AND TRADEMARK OFFICE
CERTIFICATE OF CORRECTION

PATENT NO.   : 6,218,667 B1
DATED        : April 17, 2001
INVENTOR(S)  : Ken-Ichi Nonaka, Seiichi Yokoyama and Toshifumi Suzuki It is certified that error appears in the above-identified patent and that said Letters Patent is hereby corrected as shown below:

Column 9,
Line 18, change "passes" to -- pass --;
Line numbered between 40 and 41, change "accompainied" to -- accomplished --;
Line numbered between 48 and 49, change "microlens 7" to -- microlens 107 --;
Line 67, change "7" to -- 207 --;

Column 10,
Line 2, change "7" to -- 207 --;
Line 18, after "207," insert -- and --;
Line numbered 32 and 33, change "207" to -- 207' --;
Line numbered 34 and 35, change "207" to -- 207' --;

Column 11,
Line 52, delete "in".

Column 13,
Line 38, change "claim 4" to -- claim 18 --.

This certificate supersedes Certificate of Correction issued December 25, 2001.

Signed and Sealed this

Seventeenth Day of December, 2002

JAMES E. ROGAN
*Director of the United States Patent and Trademark Office*